United States Patent [19]
Suda et al.

[11] Patent Number: 5,184,272
[45] Date of Patent: Feb. 2, 1993

[54] HIGH-SIDE SWITCH WITH OVERCURRENT PROTECTING CIRCUIT

[75] Inventors: Koichi Suda, Hitachi; Hitoshi Matsuzaki, Mito; Masayuki Wada, Katsuta; Shoichi Ozeki, Hitachi, all of Japan

[73] Assignees: Hitachi, Ltd., Tokyo; Hitachi Haramachi Semi-Conductor Ltd., Hitachi, both of Japan

[21] Appl. No.: 500,881

[22] Filed: Mar. 29, 1990

[30] Foreign Application Priority Data

Mar. 31, 1989 [JP] Japan .................... 1-78247
Jul. 5, 1989 [JP] Japan .................... 1-171803

[51] Int. Cl.$^5$ ............................ H02H 3/18
[52] U.S. Cl. ........................ 361/87; 361/100
[58] Field of Search ........... 361/87, 86, 189, 100, 361/65

[56] References Cited

U.S. PATENT DOCUMENTS

| | | | |
|---|---|---|---|
| 4,659,997 | 4/1987 | Ferland et al. | 330/257 |
| 4,814,288 | 3/1989 | Kimura et al. | 437/59 |
| 4,866,495 | 9/1989 | Kinser | 357/23.4 |
| 4,928,159 | 5/1990 | Mihara et al. | 357/42 |
| 4,929,884 | 5/1990 | Bird et al. | 323/313 |
| 5,018,041 | 5/1991 | Szepesi | 361/86 X |
| 5,023,678 | 6/1991 | Kinser | 357/23.4 |

OTHER PUBLICATIONS

Abstract of PCIM 88–International Conference in Tokyo, p. 35.
"Lossless Current Sensing with Sense FETs Enhances Motor Drive", Motorola, Apr. 1986.

Primary Examiner—Steven L. Stephan
Assistant Examiner—Ed. To
Attorney, Agent, or Firm—Antonelli, Terry, Stout & Kraus

[57] ABSTRACT

A switching circuit providing detection circuit for detecting a current which flows through a main P-channel MOSFET detection of a floating voltage dependent upon a power supply potential, a reference-voltage generating circuit for generating a reference voltage which is a floating voltage dependent upon the power supply potential and has a constant value independently of variations in power supply potential, a comparator circuit operated on a supply voltage which is a floating voltage dependent upon the power supply potential, for comparing a detected voltage from the detection circuit with the reference voltage from the reference-voltage generating means, to convert the detected voltage into a logic voltage signal (i.e., a bi-level voltage signal and a conversion circuit for converting the logic voltage outputted by the comparator circuit into a voltage measured from a ground potential.

14 Claims, 6 Drawing Sheets

5,184,272

HIGH-SIDE SWITCH WITH OVERCURRENT PROTECTING CIRCUIT

BACKGROUND OF THE INVENTION

The present invention relates to a semiconductor switching circuit using a P-channel MOSFET (metal-oxide-semiconductor field effect transistor), and more particularly to an output circuit which includes a P-channel MOSFET having a high withstand voltage and capable of delivering a large current, and which can be readily formed by semiconductor integrated circuit technology.

In recent years, the automobile has been provided with a semiconductor relay to reduce the weight of wiring harness thereof for use as an electronic switch. The combination of a switch and a load can be classified into two cases, that is classification depends on the basis of the positional relation between the switch and the load. According to a first case, the switch acts as a current source as shown in FIG. 7A. According to the second case, the switch acts as a current sink as shown in FIG. 7B. When a positive power supply terminal is placed on the upper side and a ground terminal is placed on the low side as shown in FIGS. 7A and 7B, the switch of FIG. 7A is called "high-side switch", since a switch 1 is placed on the upper side or power supply terminal side of a load 3. On the other hand, the switch in the configuration of FIG. 7B is called a "low-side switch" since the switch 1 is placed on the under side (or ground side) of the load 3. In the high-side switch of FIG. 7A, one end of the load 3 is grounded and in the low-side switch of FIG. 7B, one end of the load is connected to the high potential terminal of a D.C. power source 2. Hence, the high-side switch of FIG. 7A is generally used.

An electronic switch is usually provided with an excess-current preventing circuit for turning off the electronic switch automatically when a current flowing through the electronic switch exceeds a predetermined value. One of objects for replacing a mechanical relay by an electronic switch is to have such a protecting function. In order to perform the protecting function, it is necessary to compare the current flowing through the electronic switch with a reference value. A conventional comparator circuit is operated on a supply voltage measured from a ground potential, to produce a logic output. An output voltage corresponding to an output current which flows through the high-side switch is a floating voltage dependent on a power supply potential $V_{DD}$ since one end of the high-side switch is connected to the power supply terminal kept at the power supply potential $V_{DD}$. Accordingly, it is necessary to convert the output voltage from the high-side switch into a voltage output measured from the ground potential. This conversion is not easy. For this reason, a detected current has hitherto been compared with a reference current independently of an electric potential. That is, an output current flowing through the high-side switch (that is, output MOSFET) is converted into a small, detected output current with the aid of a current mirror current, and the small, detected output current thus obtained is compared with a reference current. A ratio of the small, detected output current to the output current flowing through the output MOSFET (namely, high-side switch) is given by the following equation:

$$\text{current mirror ratio} = \frac{\text{detected output current } I_D}{\text{output current } I_O} = \frac{S_D}{S_O} \quad (1)$$

where $S_O$ indicates the gate area of an output MOSFET, and $S_D$ the gate area of a small-sized MOSFET for obtaining the detected output current.

A typical example of the current mirror circuit is shown in FIG. 6 on page 35 of the intelligent motion section of the abstracts of the 88-International Conference of PCIM (held in Tokyo in December, 1988). This current mirror circuit is made up of an output MOSFET and a small-sized MOSFET in such a manner that one of the source and drain of the output MOSFET is directly connected to a corresponding one of the source and drain of the small-sized MOSFET, and the gate of the output MOSFET is connected directly to the gate of the small-sized MOSFET.

In a case where the low-side switch of FIG. 7B is used, a resistor is connected to the source terminal of the small-sized MOSFET as shown in FIG. 1 on page 31 of a Motorola technical report entitled "Lossless Current Sensing with SENSEFETs Enhances Motor Drive" Design published in 1986 (reprinted with permission of POWERCONVERSION & INTELLIGENT MOTION, April 1986 issue), to convert the detected output current into a voltage measured from a ground potential.

Now, let us consider a case where a current flowing through the high-side switch of FIG. 7A is detected with the aid of a current mirror circuit. The high-side switch is mainly applied to an automobile, and hence a lead storage battery is used as a D.C. power source. In an ordinary passenger car, the output voltage of the lead storage battery varies in a range from 12+4 V to 12−4 V. It is very difficult to keep the current mirror ratio of the equation (1) and a reference current constant independently of such variations in output voltage of the D.C. power source.

Further, when the current detection method used in the low-side switch of FIG. 7B is applied to the high-side switch, that is, a resistor is connected to the source terminal of a small-sized MOSFET, the detected voltage becomes a floating voltage dependent on a supply potential $V_{DD}$, and thus it becomes difficult to adequately protect the high-side switch from an excess current.

SUMMARY OF THE INVENTION

It is an object of the present invention to provide a switching circuit which can solve the above-mentioned problems of prior art, and which can precisely detect the current of an MOSFET used as a high-side switch, without being adversely influenced by variations in power supply voltage.

In order to attain the above object, a switching circuit according to the present invention comprises detection means for detecting a current which flows through a main P-channel MOSFET, in the form of a floating voltage dependent upon a power supply potential, reference-voltage generating means for generating a reference voltage which has a constant value independently of variations in power supply potential and is a floating voltage dependent on the power supply potential, comparator means operated on a supply voltage which is a floating voltage dependent upon the power supply potential, for comparing a detected voltage from the detection means with the reference voltage from the reference-voltage generating means to convert the detected voltage into a logic voltage, and conversion means for converting the logic voltage from the comparator means into a voltage measured from a ground potential.

In the switching circuit according to the present invention, the detection means, the reference-voltage generating means and the comparator means are all operated on the basis of a power supply voltage. Accordingly, the logic voltage is obtained independently of variations in power supply voltage. The logic voltage is converted into a voltage measured from the ground potential, and this voltage is used as a signal for preventing an excess current from flowing through the main P-channel MOSFET. Since the above signal is not adversely influenced by variations in power supply voltage, it is possible to surely protect the main P-channel MOSFET.

DESCRIPTION OF THE PREFERRED EMBODIMENTS

The present invention will be explained below in detail, on the basis of illustrated embodiments.

Figure 1:
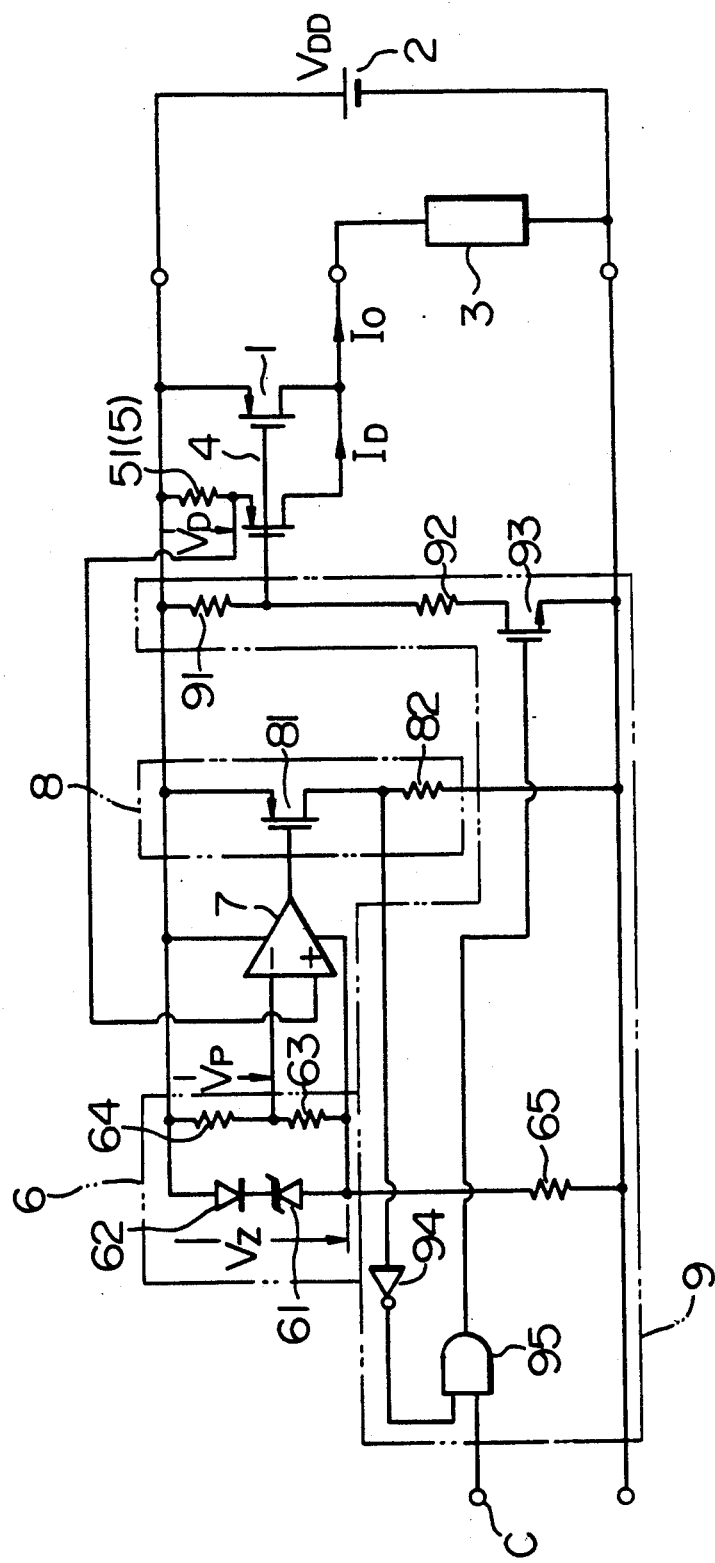
FIG. 1 is a circuit diagram showing an embodiment of a switching circuit according to the present invention, that is a switching circuit which can prevent a short-circuit current from flowing through a high-side switch.

FIG. 1 is a circuit diagram showing an embodiment of a switching circuit according to the present invention. In FIG. 1, reference numeral 1 designates a main P-channel MOSFET acting as a high-side switch, 2 a D.C. power source, 3 a load, 4 a bypass, P-channel MOSFET smaller in current capacity than the main P-channel MOSFET 1, 5 means for converting a current into a voltage, 6 reference-voltage generating means, 7 a comparator, 8 conversion means, and 9 a control circuit for exerting ON-OFF control over the gate signal of the MOSFETs 1 and 4. Referring to FIG. 1, the source of the main P-channel MOSFET 1 is connected to the positive terminal of the D.C. power source 2, and the drain of the MOSFET 1 is connected to the negative terminal of the power source 2 through the load 3. The source of the bypass P-channel MOSFET 4 is connected to the source of the MOSFET 1 through a resistor 51 which serves as the current-to-voltage conversion means 5, and the drain of the MOSFET 4 is connected to the drain of the MOSFET 1. Current mirror circuit is made up of the P-channel MOSFETs 1 and 4. The reference-voltage generating means 6 is connected between the positive and negative terminals of the D.C. power source 2 through a resistor 65, and is made up of a Zener diode 61, a diode 62, and resistors 63 and 64. In more detail, a series combination of the Zener diode 61 and the diode 62 is formed so that the diodes 61 and 62 are opposite in rectifying direction to each other, and this series combination is connected in parallel with a series combination of the resistors 63 and 64, to form the reference-voltage generating means 6. One input terminal of the comparator 7 is connected to the connecting point of the resistor 51 and the source of the bypass MOSFET 4 and the other input terminal of the comparator 7 is connected to the connecting point of the resistors 63 and 64. The comparator 7 is operated on a supply voltage which is a floating voltage dependent upon the power supply potential $V_{DD}$ of the D.C. power source 2. The conversion means 8 is connected between the positive and negative terminals of the D.C. power source 2, and is formed of a series combination of a P-channel MOSFET 81 and a resistor 82. The gate of the P-channel MOSFET 81 is connected to the output terminal of the comparator 7, and the source and drain of the MOSFET 81 are connected to the positive terminal of the D.C. power source 2 and the resistor 82, respectively. The control circuit 9 is made up of a series combination of resistors 91 and 92 and an N-channel MOSFET 93, an inverter 94, and an AND circuit 95. The series combination of the resistors 91 and 92 and the N-channel MOSFET 93 is connected between the positive and negative terminals of the D.C. power source 2. The input terminal of the inverter 94 is connected to the connecting point of the P-channel MOSFET 81 and the resistor 82, and the output terminal of the inverter 94 is connected to one input terminal of the AND circuit 95. The other input terminal of the AND circuit 95 is connected to a control signal input terminal C, and the output terminal of the AND circuit 95 is connected to the gate of the N-channel MOSFET 93. The connecting point of the resistors 91 and 92 is connected to the gates of the main P-channel MOSFET 1 and the by-pass P-channel MOSFET 4. Thus, the control circuit 9 can exert ON-OFF control over the gate signal of the MOSFETs 1 and 4 applied to the control terminal C.

The current mirror ratio of the current mirror circuit which is made up of the main P-channel MOSFET 1 and the bypass P-channel MOSFET 4, similar in structure to the main MOSFET 1, is given by the following formula:

$$\frac{I_D}{I_O} \approx \frac{S_D}{S_O} \qquad (2)$$

where $S_D$ and $S_O$ indicate quantities which have been explained in the equation (1). When the resistance of the resistor 51 is expressed by $R_O$, a voltage $V_D$ across the resistor 51 is given by $I_D R_O$. A voltage of about 6 to 7 V is developed across the series combination of the diode 62 and the Zener diode 61. This voltage is kept constant, independently of variations in output voltage of the D.C. power source 2, and is a floating voltage dependent on the power supply potential $V_{DD}$. The diode 62 is provided for the purpose of the temperature compensation for the operation voltage of the Zener diode 61. A voltage appearing across the reference-voltage generating means 6 is applied between the power supply terminals of the comparator 7. Accordingly, it is required to form the comparator 7 of circuit means which is small in power dissipation, such as a CMOS transistor. In order to prevent the short-circuit of the high-side switch (namely, main P-channel MOSFET) 1, it is necessary to turn off the switch 1 at a time the output current $I_O$ of the switch 1 exceeds a predetermined value. In the present embodiment, a voltage $V_Z$, appearing across the series combination of the diode 62 and the Zener diode 61, is divided into two parts by the resistors 63 and 64, and a ratio of the resistance of the resistor 64 to the resistance of the resistor 63 is selected so that a voltage $V_p$ appearing across the resistor 64 satisfies the following equation:

$$V_p = R_O I_{D1} \quad (3)$$

where $I_{D1}$ indicates a detected output current (namely, output current of the bypass MOSFET 4) at a time the load current $I_O$ of the switch 1 reaches the predetermined value used for preventing the short-circuit of the switch 1. When the load current $I_O$ of the switch 1 increases, the output voltage of the comparator 7 is changed from a voltage which is nearly equal to the output voltage $V_{DD}$ of the D.C. power source 2, to a voltage $(V_{DD} - V_Z)$. Thus, the P-channel MOSFET 81 is changed from an OFF-state to an ON-state. In this case, even when the control signal input terminal C is put to a high potential level, the N-channel MOSFET 93 is turned off by the operations of the inverter 94 and the AND circuit 95, and thus the high-side switch 1 is turned off. As has been explained in the foregoing, according to the present invention, the detected voltage $V_D$, corresponding to the detected output current and measured from the power supply potential $V_{DD}$, is compared with a predetermined voltage $V_p$ measured from the potential $V_{DD}$, by the comparator 7 which is operated on the D.C. voltage $V_Z$ measured from the potential $V_{DD}$. Moreover, the detected voltage $V_D$ is converted by the comparator 7 into a logic voltage i.e., a bi-level voltage signal. The P-channel MOSFET 81 converts the output voltage of the comparator 7 measured from the potential $V_{DD}$ into a voltage measured from the ground potential. Unlike the conventional switching circuit, this conversion can be made independently of variations in output voltage of the D.C. power source 2. The logic elements 94 and 95 are operated from a 5-V power source whose negative terminal is grounded. As mentioned above, according to the present invention, the output voltages of the current detection means, reference-voltage generating means and comparator are floating voltages dependent on the power source potential $V_{DD}$, and the current detection means, reference-voltage generating means and comparator are operated on D.C. voltages which are floating voltages dependent on the potential $V_{DD}$. Thus, the short-circuit of the high-side switch 1 can be surely prevented without being affected by variations in output voltage of the D.C. power source 2.

In the present embodiment, the resistor 51 is connected between the positive terminal of the D.C. power source 2 and the source of the bypass MOSFET 4, to convert the current $I_D$ of the MOSFET 4 into the detected voltage $V_D$. Accordingly, the source-drain voltage of the high-side switch 1 is different from that of the bypass MOSFET 4. Thus, it is impossible to make a ratio $I_D/I_O$ exactly equal to a ratio $S_D/S_O$. This fact will not arouse any trouble from the practical point of view, but is undesirable.

Figure 2:
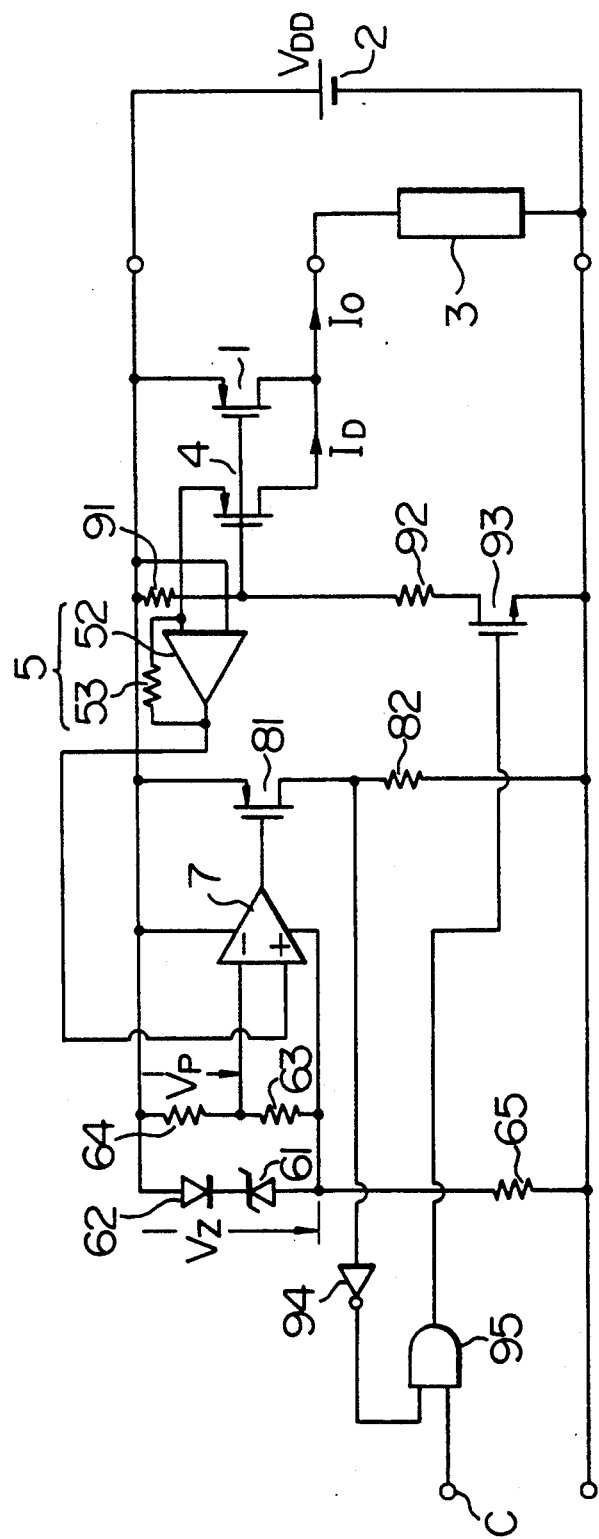
FIG. 2 is a circuit diagram showing another embodiment of a switching circuit according to the present invention.

FIG. 2 shows another embodiment of a switching circuit according to the present invention, in which embodiment an operational amplifier 52 and a feedback resistor 53 are used in place of the resistor 51 for current-voltage conversion, to obviate the above drawback. Referring to FIG. 2, one and the other input terminals of the operational amplifier 52 are connected to the source of the bypass, P-channel MOSFET 4 and the positive terminal of the D.C. power source 2, respectively. The output terminal of the operational amplifier 52 is connected to one input terminal of the comparator 7. In this case, the source of the bypass MOSFET 4 has substantially the same potential as the potential of the positive terminal of the D.C. power source 2 on the basis of the fundamental property of the operational amplifier 52, that is, "restriction on voltage of summing point". Thus, the following equation is obtained:

$$\frac{I_D}{I_O} = \frac{S_D}{S_O} \quad (4)$$

where $S_O \gg S_D$.

It is to be noted that like the comparator 7, the operational amplifier 52 is operated on the Zener voltage $V_Z$ which is a floating voltage dependent upon the power supply potential $V_{DD}$.

The present embodiment can detect a current which flows through the bypass P-channel MOSFET 4, more accurately than the embodiment of FIG. 1. In other words, the present embodiment can detect a current which flows through the main P-channel MOSFET 1 more accurately than the embodiment of FIG. 1.

Figure 3:
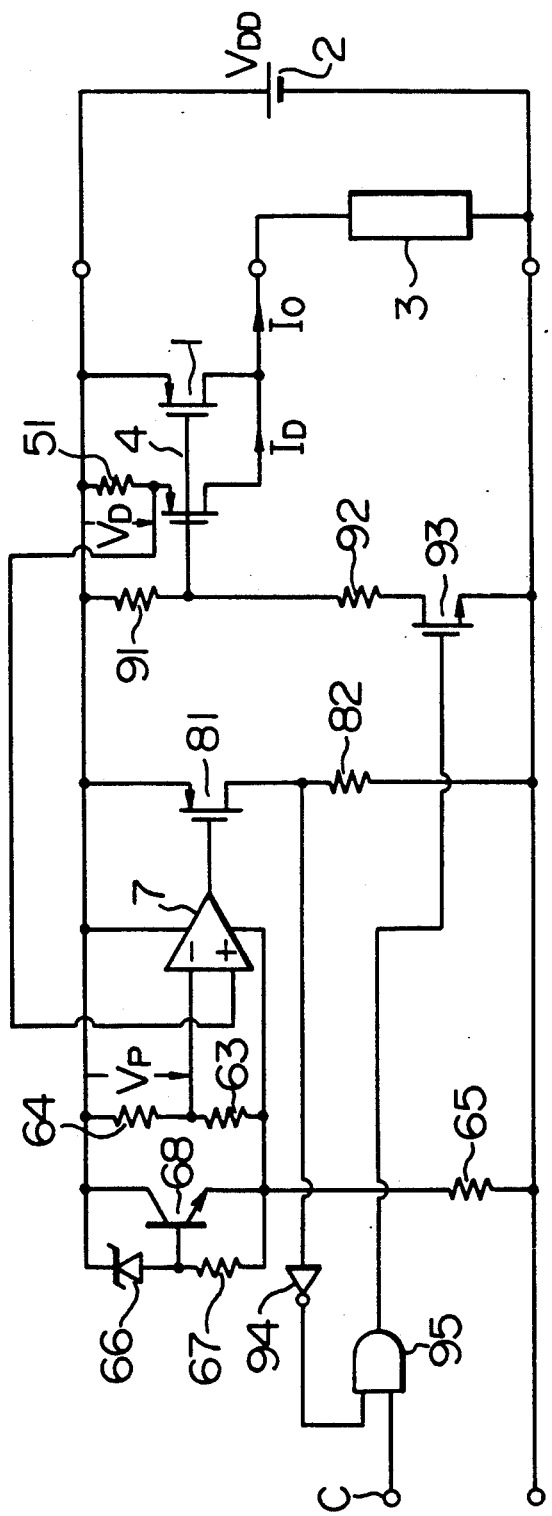
FIG. 3 is a circuit diagram showing a further embodiment of a switching circuit according to the present invention.

FIG. 3 shows a further embodiment of a switching circuit according to the present invention which embodiment includes an improved, reference-voltage generating means. The present embodiment is different from the embodiment of FIG. 1 in that a series combination of a Zener diode 66 and a resistor 67 is used in place of the series combination of the Zener diode 61 and the diode 62, a bipolar transistor 68 is connected in parallel with the series combination of the Zener diode 66 and the resistor 67, and the base of the bipolar transistor 68 is connected to the connecting point of the Zener diode 66 and the resistor 67. According to the present embodiment, a large current can be supplied to the comparator 7 without causing a large current to flow through the Zener diode 66.

Figure 4:
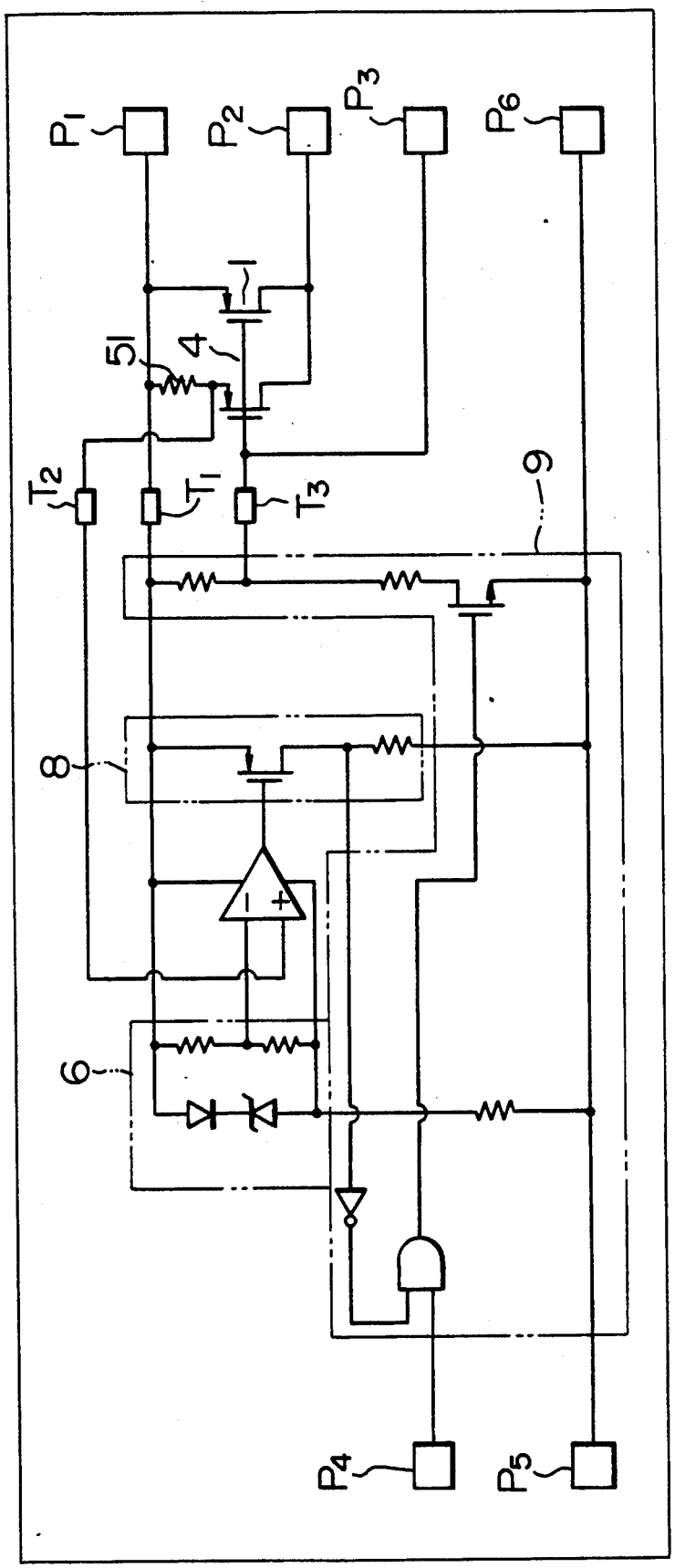
FIG. 4 is a schematic diagram which shows an example of an integrated circuit device for realizing the embodiment of FIG. 1.
Figure 5:
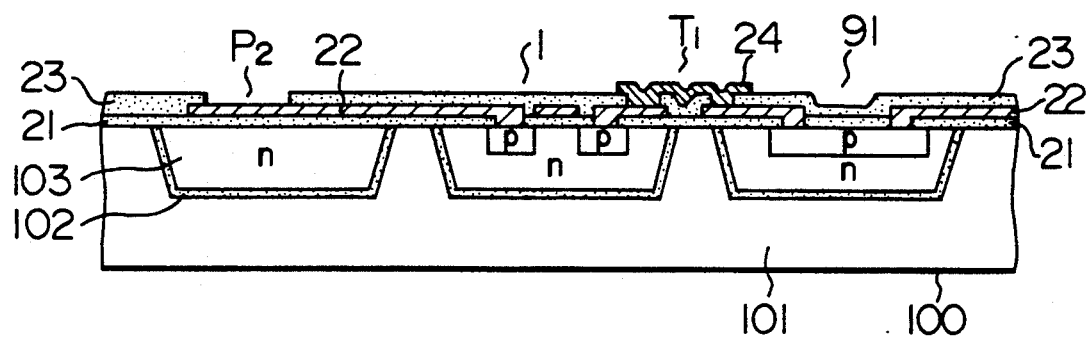
FIG. 5 is a sectional view showing a main part of the example of FIG. 4.
Figure 7A:
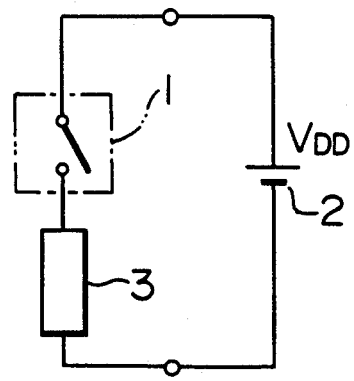
FIGS. 7A and 7B are schematic diagrams showing conventional switching circuits.
Figure 7B:
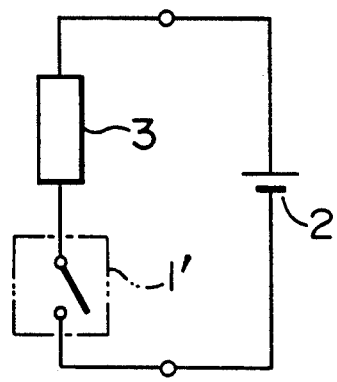

FIG. 4 shows an example of a semiconductor circuit, in which the switching circuit of FIG. 1 is formed in a single semiconductor substrate by the integrated circuit technology. In FIG. 4, reference symbol $P_1$ designates a first bonding pad connected to the source of the main P-channel MOSFET 1, $P_2$ is a second bonding pad connected to the drains of the main P-channel MOSFET 1 and the bypass, P-channel MOSFET 4, $P_3$ is a third bonding pad connected to the gates of the MOSFETs 1 and 4, $P_4$ is a bonding pad used as an input terminal, $P_5$ and $P_6$ are bonding pads to be grounded, $T_1$ is a gap portion in a wiring conductor for connecting the source of the MOSFET 1 to the ON-OFF control circuit 9, $T_2$ is a gap portion in a wiring conductor for connecting one input terminal of the comparator 7 to the connecting point of the resistor 51 and the source of the bypass MOSFET 4, and $T_3$ is a gap portion in a wiring conductor for connecting the gates of the MOSFETs 1 and 4 to the ON-OFF control circuit 9. Each of the gap portions $T_1$, $T_2$ and $T_3$ is filled up with a different conductor. The detailed structure of the semiconductor circuit of FIG. 4 will be explained below, with reference to FIG. 5. FIG. 5 is a fragmentary sectional view showing that part of the semiconductor circuit of FIG. 4 which includes the main P-channel MOSFET 1, the second bonding pad P₂, the resistor 91 of the ON-OFF control circuit 9 and wiring conductors for connecting these members 1, P₂ and 91. Referring to FIG. 5, a plurality of monocrystalline islands 103 are formed in a polycrystalline semiconductor body 101 in such a manner that each island is separated from the semiconductor body 101 by a dielectric film 102, to form a dielectric separated substrate 100, which is used as a semiconductor substrate. In FIG. 5, the semiconductor substrate 100 has, for example, three monocrystalline islands, a first one of which is used for forming the main P-channel MOSFET 1. A second island is used for forming the resistor 91, and no circuit element is formed in a third island. A first insulating layer 21 is formed o that main surface of the semiconductor substrate 100 where the islands 103 are exposed, in such a manner that recesses are formed in the insulating layer 21 at positions where an electrode is to be put in contact with one of the islands 103. A first wiring layer 22 made of, for example, aluminum is formed on the first insulating layer 21, and the gap portion T₁ is formed in the first wiring layer 22. Further, a second insulating layer 23 is formed on the first wiring layer 22 so that those portions of the first wiring layer which are adjacent to both ends of the gap portion T₁, are not covered with the second insulating layer 23 and that portion of the first wiring layer 22 which lies over the third island, is left uncovered. That exposed portion of the first wiring layer 22 which lies over the third island, is used as the second bonding pad P₂. Both ends of the gap portion T₁ are connected with each other by a second wiring layer 24 which is made of, for example, aluminum.

A method of fabricating the circuit portion of FIG. 5 will be explained below, with reference to FIGS. 6A to 6D.

Figure 6A:
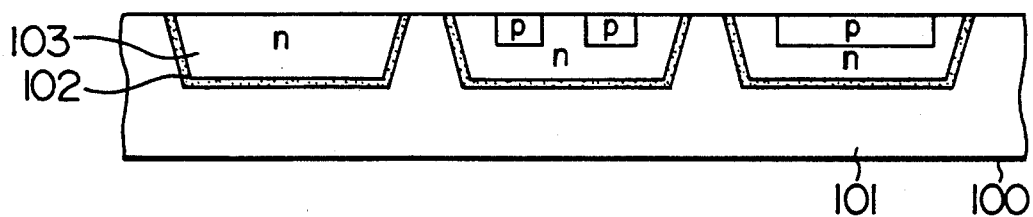
FIGS. 6A to 6D are sectional views for explaining the fabricating process of the main part of FIG. 5.
Figure 6B:
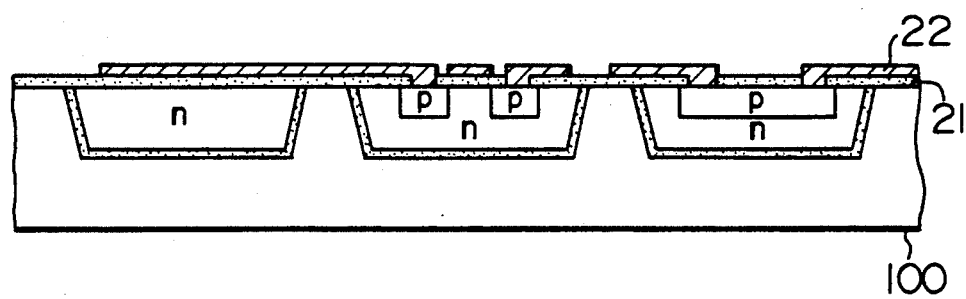
Figure 6C:
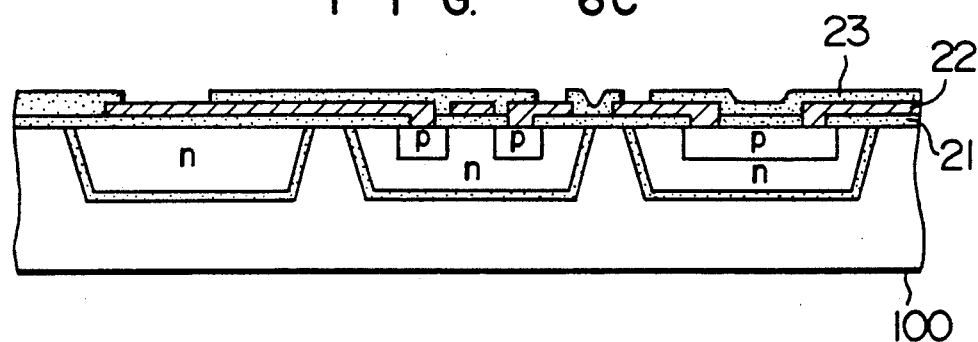
Figure 6D:
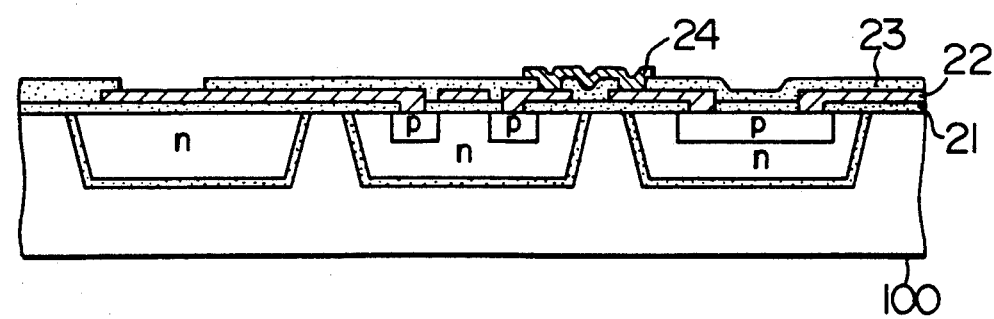

As shown in FIG. 6A, source, drain and resistive regions are formed in the first and second islands 103 of the semiconductor substrate 100 through diffusion or ion implantation techniques. Then, as shown in FIG. 6B, the first insulating layer 21 is formed on that main surface of the semiconductor substrate 100 where the islands 103 are exposed, and the first wiring layer 22 is formed on the first insulating layer 21. The first insulating layer 21 is made of SiO₂, and the first wiring layer 22 is made of aluminum. The gap portion T₁ is formed in the first wiring layer 22. Next, as shown in FIG. 6C, the second insulating layer 23 is formed on the first wiring layer 22. Then, the characteristics of the main P-channel MOSFET 1 are measured. For example, a three-layer film including an Si₃N₄ layer, an SOG (spin on glass) layer and a phosphosilicate glass layer is used as the second insulating layer 23. The second insulating layer 23 is formed so that portion of the first wiring layer 22 which lies over the third island, and those portions of the first wiring layer 22 which are adjacent to both ends of the gap portion T₁, are left uncovered. The characteristics of the main P-channel MOSFET 1 are measured by applying a source voltage and a gate voltage to the first and third bonding pads P₁ and P₃, respectively. Next, as shown in FIG. 6D, the gap portion T₁ is filled up with the second wiring layer 24, which is made of, for example, aluminum.

As mentioned above, according to the above fabricating method, the gap portion T₁ is formed in the first wiring layer 22 for connecting circuit elements so that the main P-channel MOSFET 1 is isolated from a bypass circuit, and the gap portion T₁ is filled up with the second wiring layer 24 after the characteristics of the main P-channel MOSFET 1 have been measured. Accordingly, the fabricating method has the following advantages. At first, the characteristics of the main P-channel MOSFET 1 can be precisely measured, and thus a semiconductor circuit can be obtained which is high in reliability. Secondly, the fabricating process of the semiconductor circuit is not complicated with the use of the first and second wiring layers, since first and second wiring layers are usually used in semiconductor integrated circuit technology, to connect circuit elements.

As has been explained in the foregoing, according to the present invention, a current which flows through an MOSFET serving as a high-side switch, can be precisely measured, without being adversely influenced by variations in output voltage of a power source. Accordingly, it is possible to surely protect the MOSFET from an excess current, on the basis of the detected current.

Although preferred embodiments have been explained in the foregoing, the present invention is not limited to these embodiments, but various changes and modifications can be made without departing from the spirit and scope of the invention.

We claim:
1. A switching circuit comprising:
a main P-channel MOSFET turned on or off in accordance with an external control signal, the source and drain of the main P-channel MOSFET being connected to the positive terminal of a D.C. power source and a load, respectively;
a bypass P-channel MOSFET connected between the source and drain of the main P-channel MOSFET, the bypass P-channel MOSFET being turned on or off in accordance with the external control signal, the bypass P-channel MOSFET being smaller in current capacity than the main P-channel MOSFET;
detection means for detecting a voltage indicative of current value flowing through the bypass P-channel MOSFET;
reference-voltage generating means connected to the positive terminal of the D.C. power source for generating a reference voltage having a constant value independently of variations in output voltage of the D.C. power source, wherein the reference voltage generating means includes a series combination of a diode, a Zener diode and a first resistor and a series combination of second and third resistors, the series combination of the diode, the Zener diode and the first resistor is connected between the positive and negative terminals of the D.C. power source, the series combination of the second and third resistors is connected in parallel with a series combination of the diode and the Zener diode, and the connecting point of the second and third resistors is used as an output terminal of the reference-voltage generating means;
comparator means for comparing a detected voltage from the detection means with the reference voltage from the reference-voltage generating means, to convert the detected voltage into a logic voltage, the comparator means being operated on a supply voltage which is a floating voltage dependent upon the supply potential of the D.C. power source;

conversion means for converting the logic voltage from the comparator means into a voltage measured from a ground potential; and control means for exerting ON-OFF control over the external control signal which is supplied to the main P-channel MOSFET and the bypass P-channel MOSFET, in accordance with the output of the conversion means.

2. A switching circuit according to claim 1, wherein a voltage developed across the series combination of the diode and zener diode is applied as a power supply of the comparator means.

3. A switching circuit according to claim 1, wherein the main P-channel MOSFET, the bypass P-channel MOSFET, the detection means, the reference-voltage generating means, the comparator means, the conversion means and the control means are formed in the same semiconductor substrate.

4. A switching circuit comprising:
a main P-channel MOSFET turned on or off in accordance with an external control signal, the source and drain of the main P-channel MOSFET being connected to the positive terminal of a D.C. power source and a load, respectively;

a bypass P-channel MOSFET connected between the source and drain of the main P-channel MOSFET, the bypass P-channel MOSFET being turned on or off in accordance with the external control signal, the bypass P-channel MOSFET being smaller in current capacity than the main P-channel MOSFET;

detection means for detecting a voltage indicative of current value flowing through the bypass P-channel MOSFET;

reference-voltage generating means connected to the positive terminal of the D.C. power source for generating a reference voltage having a constant value independently of variations in output voltage of the D.C. power source, wherein the reference voltage generating means includes a series combination of a diode, a Zener diode and a first resistor, a Zener diode connected between the base and collector of the bipolar transistor, a series combination of second and third resistors, and a fourth resistor connected between the base and emitter of the bipolar transistor, the series combination of the bipolar transistor and the first resistor is connected between the positive and negative terminals of the D.C. power source, the series combination of the second and third resistors is connected between the emitter and collector of the bipolar transistor, and the connecting point of the second and third resistors is used as an output terminal of the reference-voltage generating means;

comparator means for comparing a detected voltage from the detection means with the reference voltage from the reference-voltage generating means, to convert the detected voltage into a logic voltage, the comparator means being operated on a supply voltage which is a floating voltage dependent upon the supply potential of the D.C. power source;

conversion means for converting the logic voltage from the comparator means into a voltage measured from a ground potential; and control means for exerting ON-OFF control over the external control signal which is supplied to the main P-channel MOSFET and the bypass P-channel MOSFET, in accordance with the output of the conversion means.

5. A switching circuit according to claim 4, wherein a voltage developed across the series combination of the second and third resistors, which combination is connected between the emitter and collector of the bipolar transistor, is applied as a power supply of the comparator means.

6. A switching circuit according to claim 4, wherein the main P-channel MOSFET, the bypass P-channel MOSFET, the detection means, the reference-voltage generating means, the comparator means, the conversion means and the control means are formed in the same semiconductor substrate.

7. A switching circuit comprising:
a main P-channel MOSFET turned on or off in accordance with an external control signal, the source and drain of the main P-channel MOSFET being connected to the positive terminal of a D.C. power source and a load, respectively;

a bypass P-channel MOSFET connected between the source and drain of the main P-channel MOSFET, the bypass P-channel MOSFET being turned on or off in accordance with the external control signal, the bypass P-channel MOSFET being smaller in current capacity than the main P-channel MOSFET;

detection means for detecting a voltage indicative of current value flowing through the bypass P-channel MOSFET, wherein the detection means includes a resistor connected between the source of the bypass P-channel MOSFET and the positive terminal of the D.C. power source, and the detected voltage is a voltage across the resistor;

reference-voltage generating means connected to the positive terminal of the D.C. power source for generating a reference voltage having a constant value independently of variations in output voltage of the D.C. power source, wherein the reference-voltage generating means includes a series combination of a diode, a Zener diode and a first resistor and a series combination of second and third resistors, the series combination of the diode, the Zener diode and the first resistor is connected between the positive and negative terminals of the D.C. power source, the series combination of the second and third resistors is connected in parallel with a series combination of the diode and the Zener diode, and the connecting point of the second and third resistors is used as an output terminal of the reference-voltage generating means;

comparator means for comparing a detected voltage from the detection means with the reference voltage from the reference-voltage generating means, to convert the detected voltage into a logic voltage, the comparator means being operated on a supply voltage which is a floating voltage dependent upon the supply potential of the D.C. power source;

conversion means for converting the logic voltage from the comparator means into a voltage measured from a ground potential; and control means for exerting ON-OFF control over the external control signal which is supplied to the main P-channel MOSFET and the bypass P-channel MOSFET, in accordance with the output of the conversion means.

8. A switching circuit according to claim 7, wherein a voltage developed across the series combination of the diode and zener diode is applied as a power supply of the comparator means.

9. A switching circuit comprising:
a main P-channel MOSFET turned on or off in accordance with an external control signal, the source and drain of the main P-channel MOSFET being connected to the positive terminal of a D.C. power source and a load, respectively;
a bypass P-channel MOSFET connected between the source and drain of the main P-channel MOSFET, the bypass P-channel MOSFET being turned on or off in accordance with the external control signal, the bypass P-channel MOSFET being smaller in current capacity than the main P-channel MOSFET;
detection means for detecting a voltage indicative of current value flowing through the bypass P-channel MOSFET, wherein the detection means includes a resistor connected between the source of the bypass P-channel MOSFET and the positive terminal of the D.C. power source, and the detected voltage is a voltage across the resistor;
reference-voltage generating means connected to the positive terminal of the D.C. power source for generating a reference voltage having a constant value independently of variations in output voltage of the D.C. power source, wherein the reference voltage generating means includes a series combination of a diode, a Zener diode and a first resistor, a Zener diode connected between the base and collector of the bipolar transistor, a series combination of second and third resistors, and a fourth resistor connected between the base and emitter of the bipolar transistor, the series combination of the bipolar transistor and the first resistor is connected between the positive and negative terminals of the D.C. power source, the series combination of the second and third resistors is connected between the emitter and collector of the bipolar transistor, and the connecting point of the second and third resistors is used as an output terminal of the reference-voltage generating means;
comparator means for comparing a detected voltage from the detection means with the reference voltage from the reference-voltage generating means, to convert the detected voltage into a logic voltage, the comparator means being operated on a supply voltage which is a floating voltage dependent upon the supply potential of the D.C. power source;
conversion means for converting the logic voltage from the comparator means into a voltage measured from a ground potential; and
control means for exerting ON-OFF control over the external control signal which is supplied to the main P-channel MOSFET and the bypass P-channel MOSFET, in accordance with the output of the conversion means.

10. A switching circuit according to claim 9, wherein a voltage developed across the series combination of the second and third resistors, which combination is connected between the emitter and collector of the bipolar transistor, is applied as a power supply of the comparator means.

11. A switching circuit comprising:
a main P-channel MOSFET turned on or off in accordance with an external control signal, the source and drain of the main P-channel MOSFET being connected to the positive terminal of a D.C. power source and a load, respectively;
a bypass P-channel MOSFET connected between the source and drain of the main P-channel MOSFET, the bypass P-channel MOSFET being turned on or off in accordance with the external control signal, the bypass P-channel MOSFET being smaller in current capacity than the main P-channel MOSFET;
detection means for detecting a voltage indicative of current value flowing through the bypass P-channel MOSFET, wherein the detection means includes an operational amplifier, having a pair of input terminals, and a feedback resistor, one and the other input terminals of the operational amplifier are connected to the source of the bypass P-channel MOSFET and the positive terminal of the D.C. power source, respectively, the output terminal of the operational amplifier is connected to comparator means, and the feedback resistor is connected between the said one input terminal of the operational amplifier and the output terminal thereof;
reference-voltage generating means connected to the positive terminal of the D.C. power source for generating a reference voltage having a constant value independently of variations in output voltage of the D.C. power source, wherein the reference-voltage generating means includes a series combination of a diode, a Zener diode and a first resistor and a series combination of second and third resistors, the series combination of the diode, the Zener diode and the first resistor is connected between the positive and negative terminals of the D.C. power source, the series combination of the second and third resistors is connected in parallel with a series combination of the diode and the Zener diode, and the connecting point of the second and third resistors is used as an output terminal of the reference-voltage generating means;
comparator means for comparing a detected voltage from the detection means with the reference voltage from the reference-voltage generating means, to convert the detected voltage into a logic voltage, the comparator means being operated on a supply voltage which is a floating voltage dependent upon the supply potential of the D.C. power source;
conversion means for converting the logic voltage from the comparator means into a voltage measured from a ground potential; and
control means for exerting ON-OFF control over the external control signal which is supplied to the main P-channel MOSFET and the bypass P-channel MOSFET, in accordance with the output of the conversion means.

12. A switching circuit according to claim 11, wherein a voltage developed across the series combination of the diode and zener diode is applied as a power supply of the comparator means.

13. A switching circuit comprising:
a main P-channel MOSFET turned on or off in accordance with an external control signal, the source and drain of the main P-channel MOSFET being connected to the positive terminal of a D.C. power source and a load, respectively;

a bypass P-channel MOSFET connected between the source and drain of the main P-channel MOSFET, the bypass P-channel MOSFET being turned on or off in accordance with the external control signal, the bypass P-channel MOSFET being smaller in current capacity than the main P-channel MOSFET;

detection means for detecting a voltage indicative of current value flowing through the bypass P-channel MOSFET, wherein the detection means includes an operational amplifier, having a pair of input terminals, and a feedback resistor, one and the other input terminals of the operational amplifier are connected to the source of the bypass P-channel MOSFET and the positive terminal of the D.C. power source, respectively, the output terminal of the operational amplifier is connected to comparator means, and the feedback resistor is connected between the said one input terminal of the operational amplifier and the output terminal thereof;

reference-voltage generating means connected to the positive terminal of the D.C. power source for generating a reference voltage having a constant value independently of variations in output voltage of the D.C. power source, wherein the reference-voltage generating means includes a series combination of a diode, a Zener diode and a first resistor, a Zener diode connected between the base and collector of the bipolar transistor, a series combination of second and third resistors, and a fourth resistor connected between the base and emitter of the bipolar transistor, the series combination of the bipolar transistor and the first resistor is connected between the positive and negative terminals of the D.C. power source, the series combination of the second and third resistors is connected between the emitter and collector of the bipolar transistor, and the connecting point of the second and third resistor is used as an output terminal of the reference-voltage generating means;

comparator means for comparing a detected voltage from the detection means with the reference voltage from the reference-voltage generating means, to convert the detected voltage into a logic voltage, the comparator means being operated on a supply voltage which is a floating voltage dependent upon the supply potential of the D.C. power source;

conversion means for converting the logic voltage from the comparator means into a voltage measured from a ground potential; and control means for exerting ON-OFF control over the external control signal which is supplied to the main P-channel MOSFET and the bypass P-channel MOSFET, in accordance with the output of the conversion means.

14. A switching circuit according to claim 13, wherein a voltage developed across the series combination of the second and third resistors, which combination is connected between the emitter and collector of the bipolar transistor, is applied as a power supply of the comparator means.

* * * * *